United States Patent
Lin et al.

(10) Patent No.: US 9,137,922 B2
(45) Date of Patent: Sep. 15, 2015

(54) DRAWER AND SERVER USING THE SAME

(71) Applicant: Wistron Corporation, New Taipei (TW)

(72) Inventors: Hung-Lung Lin, New Taipei (TW); Chia-Hsin Hsieh, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 0 days.

(21) Appl. No.: 14/188,802

(22) Filed: Feb. 25, 2014

(65) Prior Publication Data

US 2015/0108890 A1   Apr. 23, 2015

(30) Foreign Application Priority Data

Oct. 18, 2013  (TW) .............................. 102219490 U

(51) Int. Cl.
*H05K 5/00* (2006.01)
*H05K 7/14* (2006.01)

(52) U.S. Cl.
CPC ................................. *H05K 7/1487* (2013.01)

(58) Field of Classification Search
CPC ........ G06F 1/187; G06F 1/184; G11B 33/128
USPC ....................... 361/679.33–679.39, 724–727; 312/223.2, 292, 326, 329, 223.6, 312/223.1, 303
See application file for complete search history.

(56) References Cited

U.S. PATENT DOCUMENTS

| | | | | |
|---|---|---|---|---|
| 2,861,858 A * | 11/1958 | Petschauer | ..................... | 312/283 |
| 2,943,243 A * | 6/1960 | Rachman et al. | ............. | 361/600 |
| 4,305,114 A * | 12/1981 | Takagi et al. | .................. | 361/614 |
| 4,455,711 A * | 6/1984 | Anderson | ....................... | 16/229 |
| 5,122,069 A * | 6/1992 | Brownlie et al. | ............. | 439/131 |
| 5,398,161 A * | 3/1995 | Roy | .............................. | 361/727 |
| 5,460,441 A * | 10/1995 | Hastings et al. | .............. | 312/298 |
| 5,568,362 A * | 10/1996 | Hansson | ........................ | 361/736 |
| 5,574,625 A * | 11/1996 | Ohgami et al. | .......... | 361/679.09 |
| 5,949,645 A * | 9/1999 | Aziz et al. | ..................... | 361/695 |
| 6,115,886 A * | 9/2000 | Fujita | ............................. | 16/330 |
| 6,286,916 B1 * | 9/2001 | Chen et al. | ................. | 312/223.2 |
| 6,927,968 B2 * | 8/2005 | Pols Sandhu et al. | ... | 361/679.57 |
| 6,934,148 B2 * | 8/2005 | Gorenz et al. | ........... | 361/679.46 |
| 7,448,886 B2 * | 11/2008 | Ting | .............................. | 439/138 |
| 7,753,458 B2 * | 7/2010 | Liang et al. | ................ | 312/223.2 |
| 8,513,522 B2 * | 8/2013 | Liang | .............................. | 174/66 |
| 8,727,456 B1 * | 5/2014 | Bullock et al. | ............. | 312/223.2 |
| 2002/0017838 A1 * | 2/2002 | Roesner et al. | ............ | 312/223.1 |
| 2002/0079790 A1 * | 6/2002 | Qiu | ............................ | 312/223.2 |
| 2002/0159229 A1 * | 10/2002 | Searby et al. | ................. | 361/683 |
| 2005/0265003 A1 * | 12/2005 | Coglitore et al. | ............. | 361/724 |
| 2006/0261712 A1 * | 11/2006 | Henriott et al. | ............ | 312/223.6 |
| 2010/0039769 A1 * | 2/2010 | Saisila | ..................... | 361/679.58 |
| 2010/0187957 A1 * | 7/2010 | Liang | ........................ | 312/223.2 |
| 2010/0271768 A1 * | 10/2010 | Fan et al. | .................... | 361/679.4 |

(Continued)

*Primary Examiner* — Janet M Wilkens
(74) *Attorney, Agent, or Firm* — McClure, Qualey & Rodack, LLP

(57) ABSTRACT

A drawer and a server using the same are provided. The drawer is configured for a node of a server. The drawer includes a bottom plate and a bezel. The bottom plate is configured for disposing a circuit board. The bezel is disposed at one side of the bottom plate. The bezel includes a body and a door structure connected to the body. The door structure can be opened to open an opening, such that the node is accessible through the opening. The door structure can be closed to shut the opening, such that the bezel works as an electrostatic shield of the circuit board.

4 Claims, 9 Drawing Sheets

(56) References Cited

U.S. PATENT DOCUMENTS

| | | | |
|---|---|---|---|
| 2011/0110051 A1* | 5/2011 | Chen | 361/748 |
| 2013/0026894 A1* | 1/2013 | Chen et al. | 312/223.2 |
| 2014/0049144 A1* | 2/2014 | Han et al. | 312/223.6 |

* cited by examiner

DRAWER AND SERVER USING THE SAME

This application claims the benefit of Taiwan application Serial No. 102219490, filed on Oct. 18, 2013, the subject matter of which is incorporated herein by reference.

BACKGROUND OF THE INVENTION

1. Field of the Invention

The disclosure relates in general to a drawer and a server using the same, and more particularly to a drawer comprising a movable or rotatable door structure and a server using the drawer.

2. Description of the Related Art

Typically, in a server, nodes, each comprising devices such as a hard disc and circuit boards, are packaged by components such as a bezel and an upper cover. Facebook has promoted an attractive open compute project (OCP). In order to increase the efficiency of the data center at a lowest cost, devices and components, such as a power switch, a hard disc, circuit boards and the like, of a server according to OCP are rearranged. For example, the hard disc is now disposed outside the node. In addition, the bezel has been removed from the server, such that the server is "open" and the user is allowed to operate the devices and components disposed inside the node directly.

However, it is difficult for the server of open type hardware design to pass relevant tests such as electromagnetic interference (EMI), electromagnetic compatibility (EMC) and safety. In contrast, the conventional server package structure can pass these tests but is not applicable to the open type hardware design.

SUMMARY OF THE INVENTION

The disclosure is directed to a drawer and a server using the same. The drawer and the server are configured for the open type hardware design and able to pass relevant tests such as EMI, EMC and safety.

According to one embodiment, a drawer configured for a node is provided. The drawer includes a bottom plate and a bezel. The bottom plate is configured for disposing a circuit board. The bezel is disposed at one side of the bottom plate. The bezel includes a body and a door structure moveably or rotatably connected to the body. The door structure can be opened to open an opening, such that the node is accessible through the opening. The door structure can be closed to shut the opening, such that the bezel works as an electrostatic shield of the circuit board.

According to another embodiment, a server is provided. The server includes a chassis and at least one node organized in the chassis. The node includes a drawer. The drawer includes a bottom plate and a bezel. The bottom plate is configured for disposing a circuit board. The bezel is disposed at one side of the bottom plate. The bezel includes a body and a door structure moveably or rotatably connected to the body. The door structure can be opened to open an opening, such that the node is accessible through the opening. The door structure can be closed to shut the opening, such that the bezel works as an electrostatic shield of the circuit board.

Figure 1:
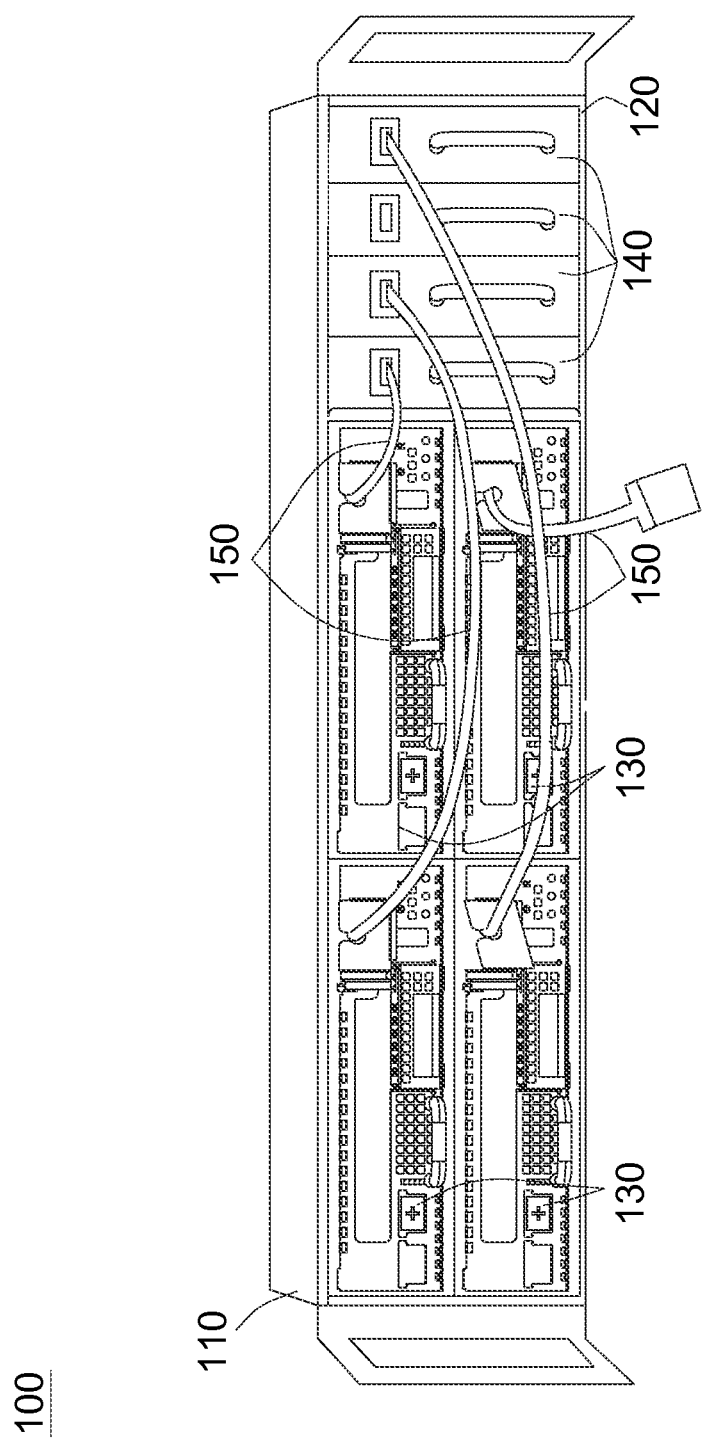
FIG. 1 schematically shows a server according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Detailed descriptions of a drawer according to this disclosure and a server using the same are provided below with reference to accompanying drawings. However, the accompanying drawings, which illustrate only some of the implementations, together with following embodiments are not for limiting the scope of protection of the disclosure. The same reference numerals are used throughout the drawings and detailed descriptions to indicate the same elements. The accompanying drawings may not be shown based on actual sizes of the elements, and some structural characteristics, elements and reference numerals may be omitted from the drawings.

FIG. 1 schematically shows a server 100 according to one embodiment of the disclosure. The server 100 includes a housing 110 and a chassis 120. Through the use of the chassis 120, the devices and units of the server 100 are disposed at their predetermined positions and together are organized in the housing 110.

The server 100 further includes at least one node 130 and at least one hard disc unit 140. The server 100 may further include at least one cable 150, an internal power (not shown), a fan (not shown) and the like. The node 130, the hard disc unit 140, the internal power, the fan and the like are disposed in the chassis 120 and can be further organized in the housing 110. The cable 150 may connect, for example, the node 130 and the hard disc unit 140. Four nodes 130, four hard disc units 140 and four cables 150 are exemplary shown in FIG. 1, however, the numbers of the node, the hard disc unit and the cable are not limited thereto. Further, the numbers of the node, the hard disc unit and the cable may not be the same.

Figure 2:
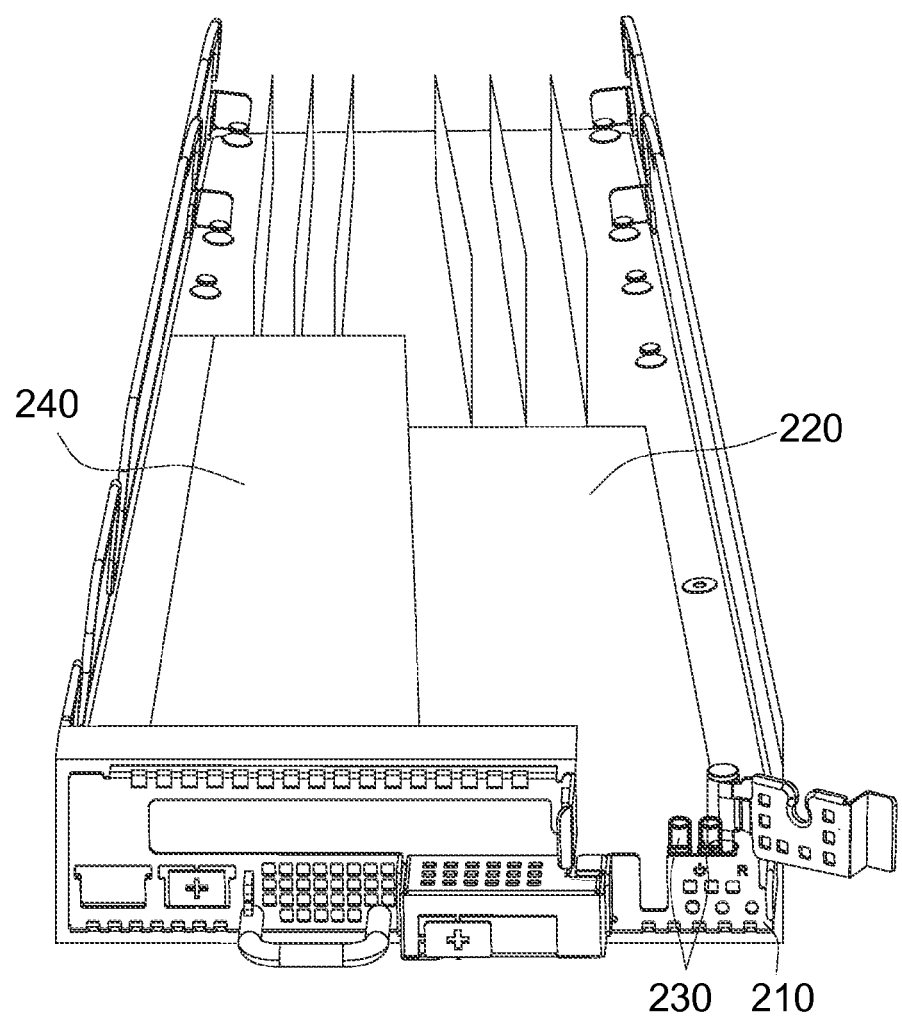
FIG. 2 schematically shows a node of a server according to one embodiment of the disclosure.

FIG. 2 schematically shows a node 130 of the server 100 according to one embodiment of the disclosure. The node 130 includes a drawer 210, a circuit board 220 and a power switch 230. The circuit board 220, such as a motherboard, may include various ports (such as the port 250 shown in FIG. 6). In one embodiment, the node 130 may further include an expansion card 240.

Figure 3:
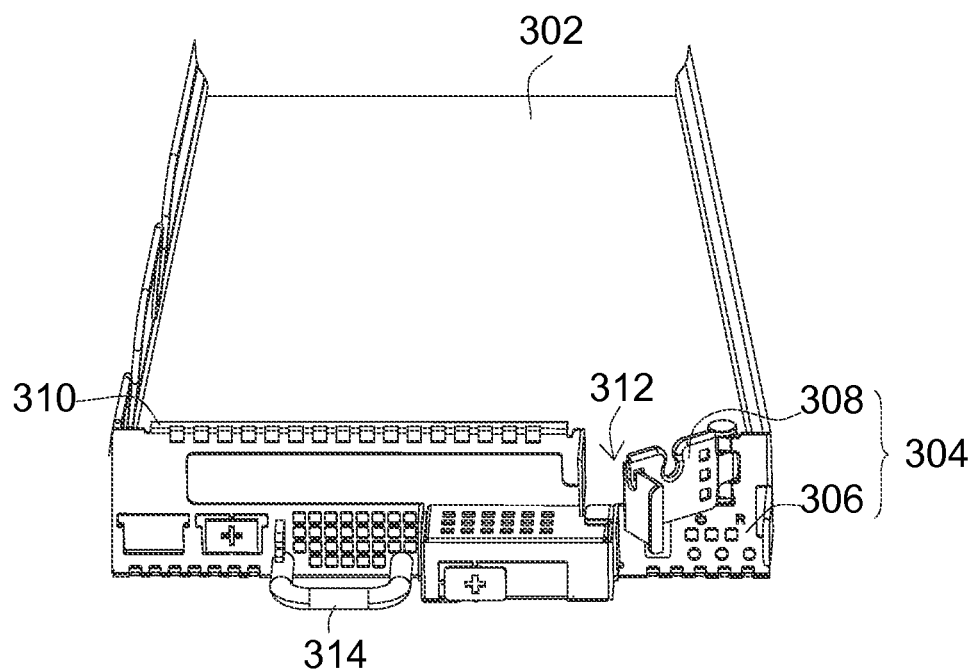
FIG. 3 schematically shows a drawer configured for a node according to one embodiment of the disclosure.

FIG. 3 schematically shows a drawer 210 configured for the node 130 according to one embodiment of the disclosure. The drawer 210 includes a bottom plate 302 and a bezel 304.

The bottom plate 302 works the same as a tray of a server according to OCP. The bottom plate 302 is configured for disposing devices such as the circuit board 220 (shown in FIG. 2).

The bezel 304 is disposed at one side of the bottom plate 302. The bezel 304 includes a body 306 and a door structure 308. To assure the electrostatic shielding effect of the bezel 304, in one embodiment, the body 306 may have an upper bending portion 310. The upper bending portion 310 contacts the housing 110 of the server 10 or the bottom plate 302 of another node 130 to provide a conductive path between the housing 110 and the node 130 or between the node 130 and the node 130. For example, in the server 10 of FIG. 1, an upper bending portion 310 (not shown) of the node 130 at the top left corner may contact the housing 110, and an upper bending portion 310 of the node 130 (not shown) at the bottom left corner may contact the bottom plate of the node 130 at the top left corner.

The door structure 308 is moveably or rotatably connected to the body 306. The door structure 308 can be opened to open an opening 312, such that the node 130 is accessible through the opening 312. The door structure 308 can be closed to shut the opening 312, such that the bezel 304 works as an electrostatic shield of the circuit board 220. The configuration of the door structure 308 is not limited to that shown in the drawings. The door structure 308 may have various configurations as long as the door structure 308 can be opened to open the opening 312 so that the node 130 is accessible and can be closed to shut the opening 312 so that the bezel 304 works as an electrostatic shield of the circuit board. Further, the door structure 308 may be disposed at various portions of the bezel 304 and may have various sizes as needed.

In one embodiment, the drawer 210 may further include a handle 314, which makes it easier to pull out the drawer 210.

Figure 4A:
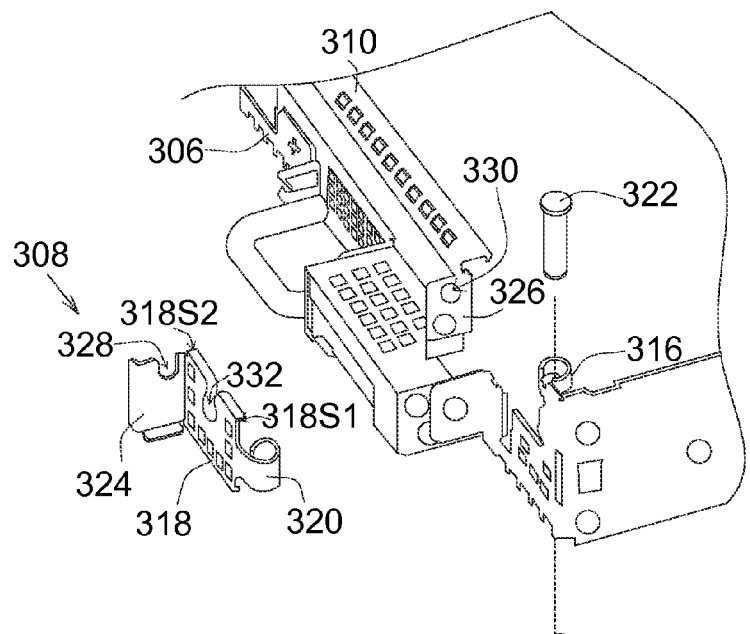
FIGS. 4A-4D schematically show the portion of a drawer close to a door structure thereof according to one embodiment of the disclosure.
Figure 4B:
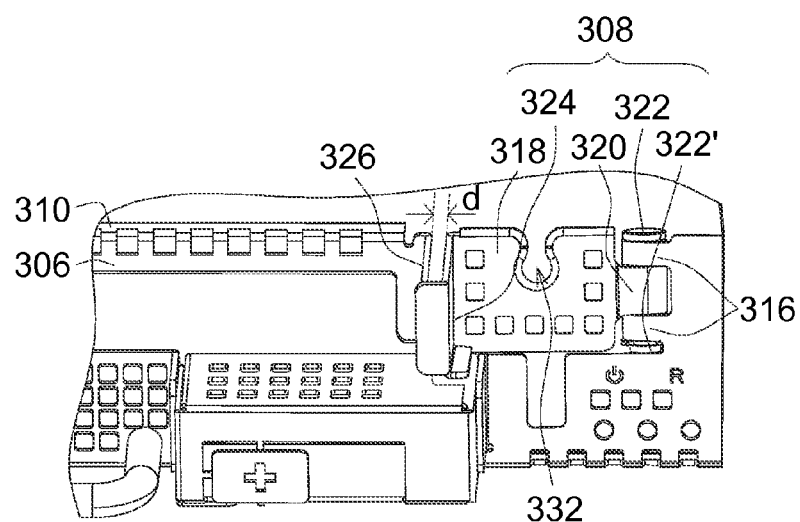
Figure 4C:
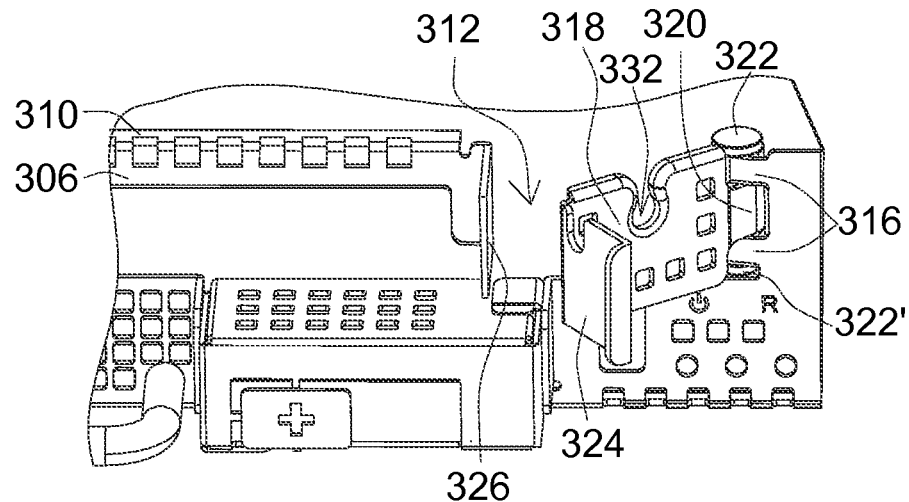
Figure 4D:
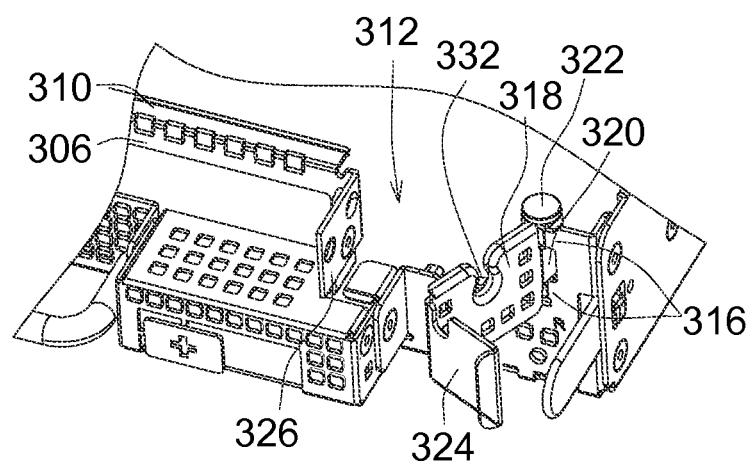

FIGS. 4A-4D schematically show the door structure 308 and related components of the body 306 according to one embodiment of the disclosure. FIG. 4A is an explosion diagram of the door structure 308. FIGS. 4B, 4C, and 4D show the closed, half-open, and open door structure 308, respectively.

Referring to FIG. 4A, the body 306 includes a first pivot component 316. The door structure 308 includes a door panel 318, a second pivot component 320 and a pivot shaft 322. The second pivot component 320 is connected to one side 318s1 of the door panel 318. The pivot shaft 322 passes through the first pivot component 316 and the second pivot component 320. For example, as shown in FIGS. 4B-4D, in one embodiment, the body 306 includes two first pivot components 316 respectively disposed above and under the second pivot component 320. All of the first pivot components 316 and the second pivot component 320 have hollow structures. The pivot shaft 322 may be a pin and sequentially passes through the first pivot component 316 disposed above the second pivot component 320, the second pivot component 320, and the first pivot component 316 disposed under the second pivot component 320. Thus, the door panel 318 can rotate about the pivot shaft 322 with respect to the body 306 to open or close the door structure 308. Referring back to FIG. 4A, in one embodiment, the door structure 308 may further include a pivot shaft fastener 322' for holding the pivot shaft 322. In one embodiment, the pivot shaft fastener 322' may be an E-ring.

The door structure 308 may further include a fastening plate 324 configured for fastened with the body 306. The fastening plate 324 is connected to the other side 318s2 of the door panel 318. For example, in one embodiment, the body 306 may have an L-shaped extending portion 326 fastened with the fastening plate 324 through a fastener (such as the fastener 334 shown in FIG. 8), such that the door panel 318 and the body 306 are fixed with each other. For example, as shown in FIG. 4A, in one embodiment, the fastening plate 324 may have a first through hole 328, and the L-shaped extending portion 326 may have a second through hole 330 with screw thread. A screw can be used as a fastener passing through the first through hole 328 and the second through hole 330 and be fixed by the screw thread of the second through hole 330. By doing so, the fastening plate 324 and the L-shaped extending portion 326 are engaged with each other, and thereby the door panel 318 and the body 306 are fixed with each other. In one embodiment, as shown in FIG. 4B, the fastening plate 324 and the L-shaped extending portion 326 may be separated by a distance d which substantially equal to the thickness t (shown in FIG. 8) of a blanking plate 242 (shown in FIGS. 7 and 8) of the expansion card 240 of the server 10. As such, the blanking plate 242 of the expansion card 240 can be interposed between the fastening plate 324 and the L-shaped extending portion 326, thereby the position of the expansion card 240 is fixed.

In one embodiment, the door panel 318 may further have an organizing portion 332 for organizing the cable 150 (shown in FIGS. 1 and 6) of the server 10. The size of the organizing portion 332 may be determined according to the number and diameter of the cable 150 to be organized in the organizing portion 332. For example, the size of the organizing portion 332 may be adjusted, such that not much space is left in the organizing portion 332 when the cable 150 passes therethrough in order to avoid a negative effect on the electrostatic shielding.

FIGS. 5-8 illustrate the applications of the door structure 308 of the drawer 210 according to one embodiment of the disclosure.

Figure 5:
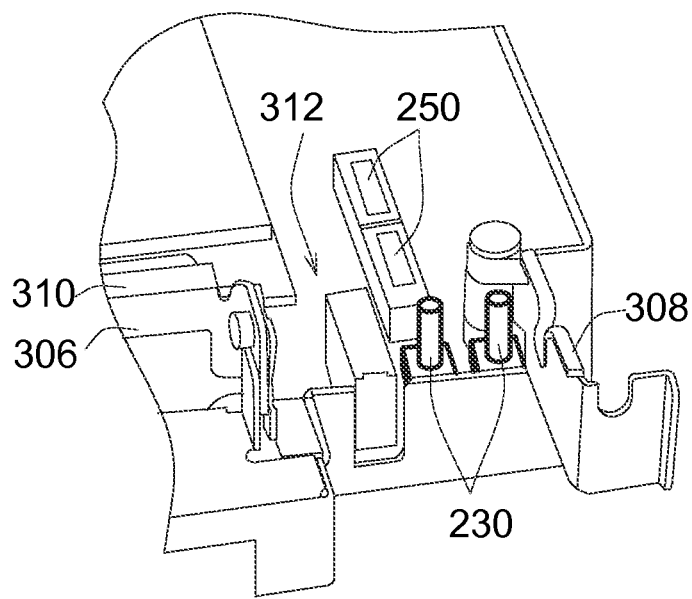
FIGS. 5-8 schematically show a door structure configured for a drawer according to one embodiment of the disclosure.

Referring to FIG. 5, the door structure 308 can be opened. As such, the user can operate the devices and components disposed inside of the node 130 directly. For example, the user may press the power switch 230 to turn on or turn off the power, and/or connect the cable 150 (shown in FIG. 6) to the port 250.

Figure 6:
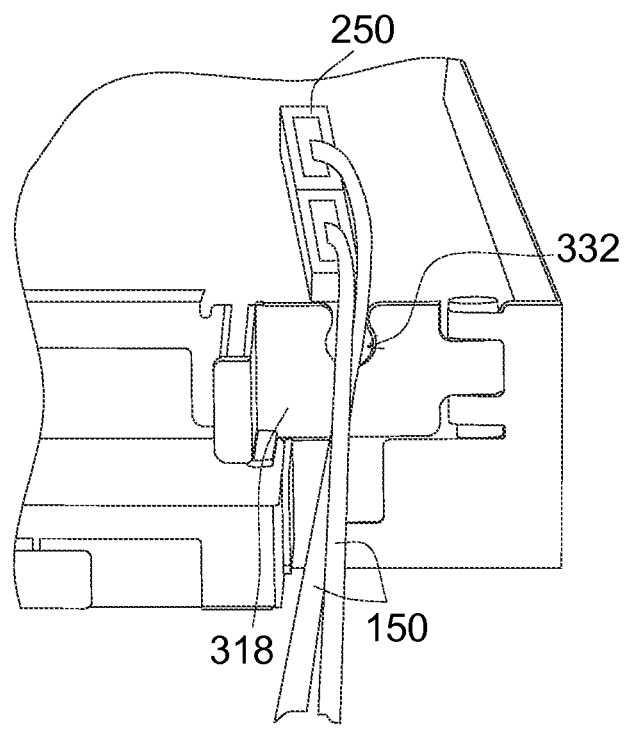

Referring to FIG. 6, the cable 150 can be organized in the organizing portion 332 when connected to the port 250. Not much space is left in the organizing portion 332 when the cable 150 passes therethrough. As such, the electrostatic shielding will not be disadvantageously affected.

Figure 7:
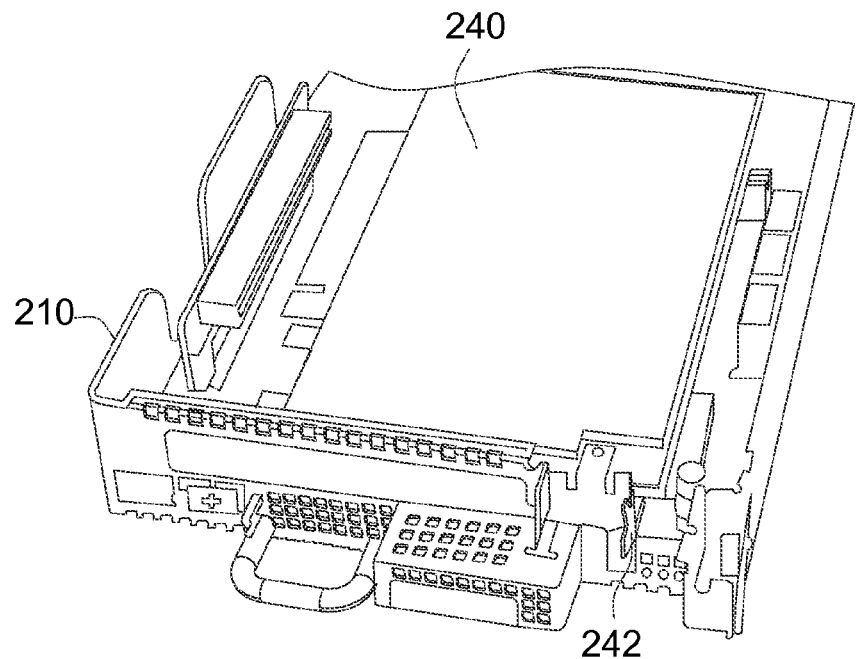

Referring to FIG. 7, when the door structure 308 is opened, the expansion card 240 can be easily unplugged without pulling out the drawer 210.

Figure 8:
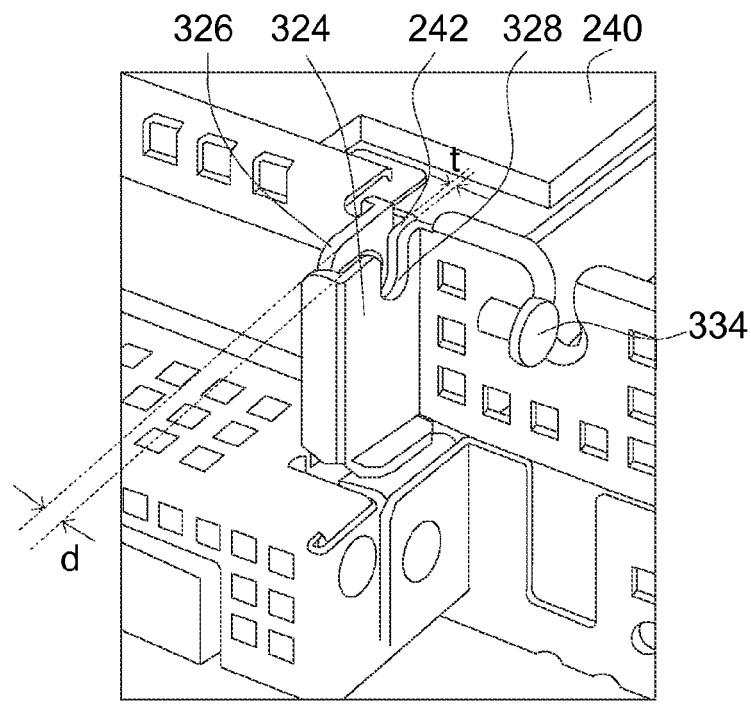

Referring to FIG. 8, the fastening plate 324 and the L-shaped extending portion 326 may be separated by a distance d which substantially equal to the thickness t of the blanking plate 242 of the expansion card 240. As such, the blanking plate 242 of the expansion card 240 can be interposed between the fastening plate 324 and the L-shaped extending portion 326. In addition, when the fastening plate 324 and the L-shaped extending portion 326 are engaged with each other through the fastener 334 (such as a screw), the blanking plate 242 may also be fastened by the fastener 334, and thereby the position of the expansion card 240 is fixed. As such, an extra bracket is unneeded.

Figure 9A:
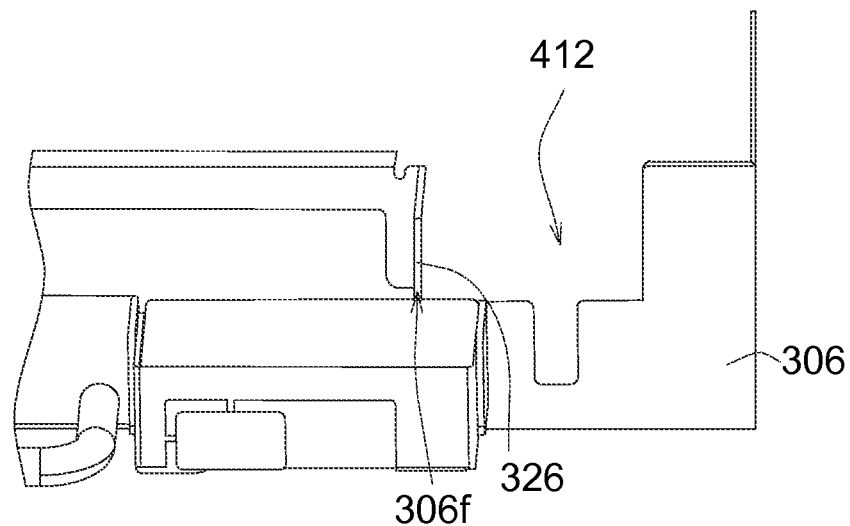
FIGS. 9A-9B schematically show the portion of a drawer close to a door structure thereof according to another embodiment of the disclosure.
Figure 9B:
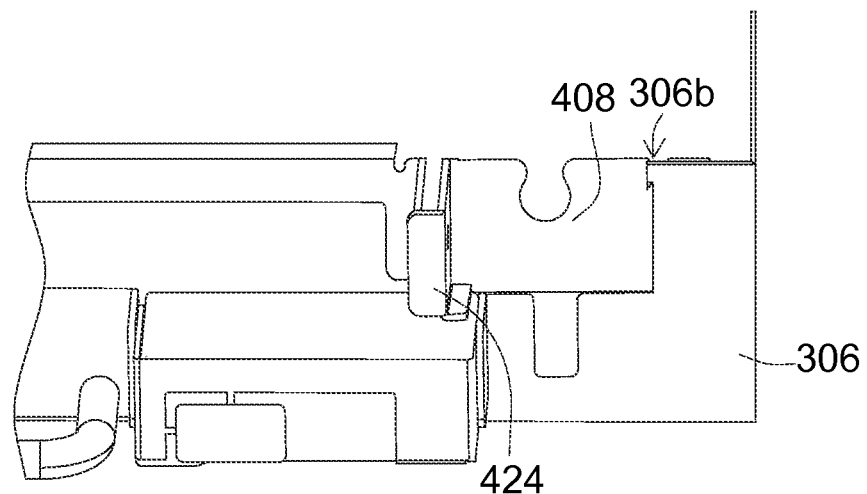
Figure 10A:
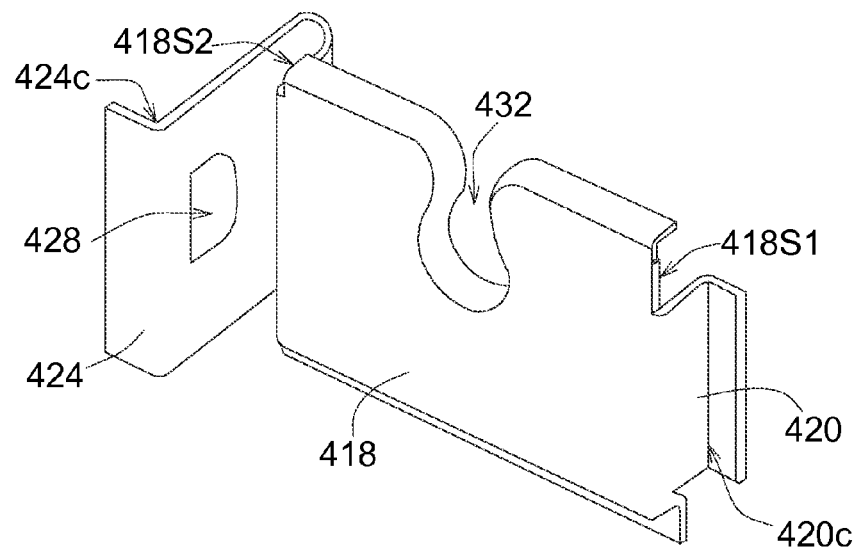
FIGS. 10A-10B schematically show a door structure of a drawer according to another embodiment of the disclosure.
Figure 10B:
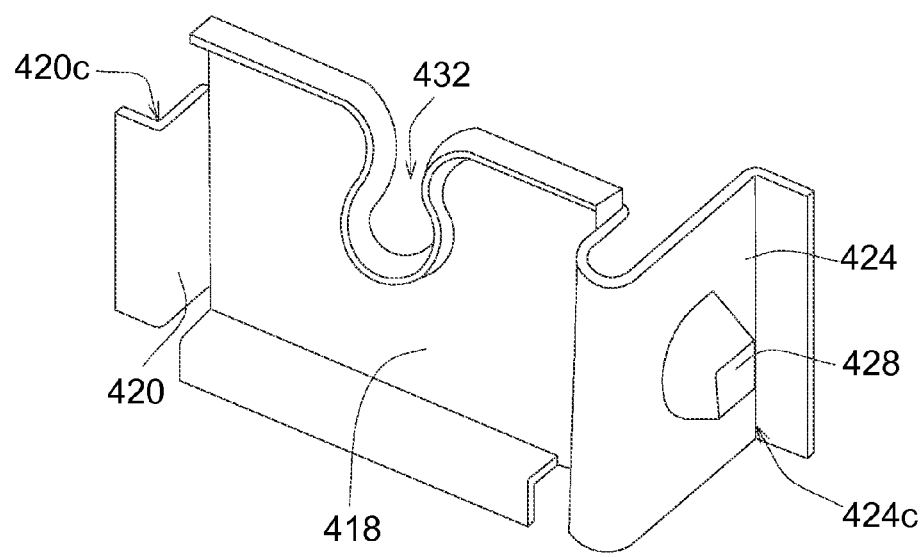

FIGS. 9A-9B schematically show a door structure 408 and related components of the body according to another embodiment of the disclosure. FIGS. 10A-10B schematically show details of the door structure 408 according to the another embodiment. The function of the door structure 408 is similar to that of the door structure 308, and the similarities are not repeated here.

Referring to FIG. 9A, when the door structure 408 is opened, the opening 412 will be opened, such that the node 130 is accessible through the opening 412. Referring to FIG. 9B, when the door structure 408 is closed, the opening 412 will be shut, such that the bezel 304 works as an electrostatic shield of the circuit board 220.

Referring to FIGS. 10A-10B, the door structure 408 includes a door panel 418, a first engaging component 420 and a second engaging component 424. The first engaging component 420 is disposed at one side 418s1 of the door panel 418. The second engaging component 424 is disposed at the other side 418s2 of the door panel 418. When the door structure 408, rather than the door structure 308, is used, the body 306 may not have the first pivot component 316. The first engaging component 420 and the second engaging component 424 are used for engaging the door panel 418 and the body 306. For example, as shown in FIGS. 9B-10B, in one embodiment, one of the first engaging component 420 and the second engaging component 424 extends backward and the other extends forward from the door panel 418 to engage a back side 306b and a front side 306f of the body 306, respectively. For example, the first engaging component 420 and the second engaging component 424 may have corners 420c and 424c, respectively. Through the corners 420c and 424c, the first engaging component 420 and the second engaging component 424 are engaged with the back side 306b and the front side 306f of the body 306. In one embodiment, the door structure 408 may have elasticity so that the door structure 408 can be conveniently engaged with the body 306. In one embodiment, the door structure 408 with elasticity may be formed by, for example, stainless steel.

In one embodiment, the body 306 has an L-shaped extending portion 326. To match the L-shaped extending portion 326, the second engaging component 424 may be U-shaped and have an abutment portion 428. The abutment portion 428 is configured for abutting against the L-shaped extending portion 326, such that the second engaging component 424 and the L-shaped extending portion 326 are engaged. In one embodiment, the door structure or the abutment portion 428 may have elasticity, such that the blanking plate 242 of the expansion card 240 for the server 10 can be interposed between the abutment portion 428 and the L-shaped extending portion 326. By doing so, the position of the expansion card 240 can be fixed without any extra bracket. In addition, if the second engaging component 424 is U-shaped and has an abutment portion 428 with elasticity, the door structure 408 can be opened more easily.

In one embodiment, the door panel 418 may further have an organizing portion 432. The organizing portion 432 is similar to the organizing portion 332, and the similarities are not repeated here.

In summary, the drawer configured for the node according to embodiments of the disclosure includes a bezel. The bezel includes a door structure. The door structure can be opened to open an opening, such that the node is accessible through the opening. Thus, the drawer according to embodiments of the disclosure can be used in a server of open type hardware design. The door structure can be closed to shut the opening, such that the bezel works as an electrostatic shield of the circuit board. As such, the drawer according to embodiments of the disclosure can pass the relevant tests such as EMI, EMC and safety even follows the design concept of OCP.

Moreover, the door structure of the drawer according to embodiments of the disclosure is multi-functional. For example, the door structure can be used to fix the expansion card, and thereby the structure of the server can be further simplified. In addition, the door structure can also be used to organize the cable and makes the appearance of the server tiny.

Additionally, the door structure according to embodiments of the disclosure has a simple structure and is easy to manufacture. Even the door structure being multi-functional, a complicated manufacturing process is not required. Thus, the door structure according to embodiments of the disclosure can be manufactured at a low cost.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A server, comprising:
    a chassis; and
    at least one node organized in the chassis, the node comprising a drawer, wherein the drawer comprises:
    a bottom plate configured for disposing a circuit board; and
    a bezel disposed at one side of the bottom plate, the bezel comprising a body and a door structure moveably or rotatably connected to the body, wherein the door structure can be opened to open an opening such that the node is accessible through the opening, and the door structure can be closed to shut the opening such that the bezel works as an electrostatic shield of the circuit board;
    wherein the door structure comprises a fastening plate connected to one side of the door panel, the body has a L-shaped extending portion fastened with the fastening plate through a fastener such that the door panel and the body are fixed with each other, and the fastening plate and the L-shaped extending portion are separated by a distance substantially equal to a thickness of a blanking plate of an expansion card for a server such that the blanking plate of the expansion card can be interposed between the fastening plate and the L-shaped extending portion.

2. The server according to claim 1, wherein the body comprises a first pivot component, and the door structure further comprises:
    a door panel;
    a second pivot component connected to the other side of the door panel; and
    a pivot shaft passing through the first pivot component and the second pivot component, such that the door panel rotates about the pivot shaft with respect to the body to open or close the door structure.

3. The server according to claim 2, wherein the door structure further comprises a pivot shaft fastener for holding the pivot shaft.

4. The server according to claim 2, wherein the door panel has an organizing portion for organizing a cable of the server.

* * * * *